United States Patent
Maqbool

(10) Patent No.: US 12,231,091 B1
(45) Date of Patent: Feb. 18, 2025

(54) MULTIPLE TRANSISTOR LNA MMIC DESIGN

(71) Applicant: AmpliTech, Inc., Bohemia, NY (US)

(72) Inventor: Fawad Maqbool, Bohemia, NY (US)

(73) Assignee: AmpliTech, Inc., Bohemia, NY (US)

( * ) Notice: Subject to any disclaimer, the term of this patent is extended or adjusted under 35 U.S.C. 154(b) by 455 days.

(21) Appl. No.: 17/322,448

(22) Filed: May 17, 2021

Related U.S. Application Data

(60) Provisional application No. 63/025,797, filed on May 15, 2020.

(51) Int. Cl.
| | |
|---|---|
| H03F 1/02 | (2006.01) |
| H03F 1/26 | (2006.01) |
| H03F 1/56 | (2006.01) |
| H03F 3/187 | (2006.01) |

(52) U.S. Cl.
CPC ............... *H03F 1/26* (2013.01); *H03F 1/565* (2013.01); *H03F 3/187* (2013.01); *H03F 2200/255* (2013.01); *H03F 2200/294* (2013.01)

(58) Field of Classification Search
CPC . H03F 1/26; H03F 1/565; H03F 3/187; H03F 2200/255; H03F 2200/294
USPC .................................................. 330/277, 301
See application file for complete search history.

(56) References Cited

U.S. PATENT DOCUMENTS

| | | | |
|---|---|---|---|
| 5,276,406 A * | 1/1994 | Samay .................. | H03F 3/1935 330/277 |
| 5,717,608 A | 2/1998 | Jensen | |
| 6,323,426 B1 | 11/2001 | Hoshizaki et al. | |
| 6,622,028 B1 | 9/2003 | Abdelmonem et al. | |
| 6,963,758 B2 | 11/2005 | Narahashi et al. | |
| 7,266,360 B2 * | 9/2007 | Kang ...................... | H04B 1/28 455/302 |
| 7,583,150 B2 * | 9/2009 | Buer ...................... | H03F 1/02 330/133 |
| 7,616,061 B2 | 11/2009 | Cha et al. | |

(Continued)

OTHER PUBLICATIONS

U.S. Appl. No. 17/322,517, filed May 17, 2021, Fawad Maqbool, Multiple Transistor Low Noise Amplifier Optimized for Cryogenic Temperatures.

(Continued)

*Primary Examiner* — Andrea Lindgren Baltzell
*Assistant Examiner* — Khiem D Nguyen
(74) *Attorney, Agent, or Firm* — Polsinelli LLP

(57) ABSTRACT

The present disclosure is directed to low noise amplifiers built as a monolithic millimeter or microwave integrated circuit (MMIC) that includes an amplification stage with two or more field effect transistors (FETS) connected in a parallel configuration. An amplifier may include two, three, or more amplification stages. Amplifiers consistent with the present disclosure may operate at frequencies in the range of 3 gigahertz (GHz) to 9 GHz. Each transistor or amplification stage may include their own series feedback element. A second amplification stage may include two parallel transistors, with one having a series feedback element and a feedback shunt spanning the second stage. A third stage may include a single transistor. Each of the transistors connected in a parallel configuration may be tuned to a different corner frequency in order to improve metrics of noise figure, gain, input return loss, and output return loss not possible with conventional amplifier designs.

24 Claims, 10 Drawing Sheets

(56) References Cited

U.S. PATENT DOCUMENTS

| | | |
|---|---|---|
| 7,795,965 B2 | 9/2010 | Suzuki et al. |
| 8,115,554 B2* | 2/2012 | Ng .................. H03F 3/211 |
| | | 330/124 R |
| 8,786,369 B2* | 7/2014 | Takagi ................ H03F 3/195 |
| | | 330/124 R |
| 9,397,134 B1 | 7/2016 | Lewkow |
| 11,008,115 B2 | 5/2021 | Wozniak |
| 2013/0003373 A1 | 1/2013 | Hamby |
| 2017/0077580 A1 | 3/2017 | Kawaguchi et al. |
| 2017/0205281 A1 | 7/2017 | Cassainge |
| 2018/0327106 A1 | 11/2018 | Wozniak |

OTHER PUBLICATIONS

U.S. Appl. No. 17/322,653, filed May 17, 2021, Fawad Maqbool, Low Noise Amplifiers/Front-Ends Optimized for Use in 5G Networks.
U.S. Appl. No. 17/322,517 Office Action mailed Jul. 6, 2023.
U.S. Appl. No. 17/322,517 Final Office Action mailed Feb. 29, 2024.
U.S. Appl. No. 17/322,653 Final Office Action mailed Mar. 6, 2024.
U.S. Appl. No. 17/322,653 Office Action mailed Nov. 13, 2023.

\* cited by examiner

MULTIPLE TRANSISTOR LNA MMIC DESIGN

CROSS-REFERENCE TO RELATED APPLICATIONS

This application claims priority benefit of U.S. provisional patent application 63/025,797 filed on May 15, 2020, the disclosure of which is incorporated herein by reference.

BACKGROUND OF THE INVENTION

Field of the Invention

The present disclosure is generally related to low noise amplifiers. More specifically, the present disclosure is directed to monolithic integrated circuit amplifiers.

Description of the Related Art

An electrical or electronic amplifier is a device that increases the voltage, current, or power of an input signal. One example of an amplifier is an audio amplifier that receives a low voltage electrical signal and that outputs an electrical signal at an increased voltage as compared to the input signal. This output signal may be provided to a speaker such that sounds may be heard by a person. Amplifiers commonly increase both the voltage, current, or power of an input signal such that information included in the signal may be used. "Gain" is a term that refers to a ratio of an output signal to an input signal of an amplifier. This term, gain, was originally used in reference to vacuum tube amplifiers in the 1940s and is now used in reference to transistor circuits. Transistors are fabricated using semi-conductive materials arranged in various configurations. Examples of different types of transistors include bipolar transistors, field-effect transistors (FETS), metal-semiconductor field-effect transistors (MESFETS), and metal-oxide-semiconductors field-effect transistors (MOSFETS). Other electronic devices that produce gain or may be arranged to form amplifier circuits include components such as tunnel diodes.

When applied properly, an amplifying circuit provides enough gain to serve a useful purpose without exacerbating negative side effects that can be encountered when a gain of a circuit is increased beyond a threshold level. Negative side effects that can be encountered in an amplifier include signal distortion, increased noise, and a reduced signal to noise ratio. Signal distortion, such as harmonic distortion or nonlinear mixing can result in changing characteristics or shape of a signal to a point where the signal is not useful for its intended purpose. The term noise is used in electronic circuits to refer to anomalous electronic signals or disturbances that can add to or detract from a signal. When a level of electrical or electronic noise is above a threshold level as compared to a level of an electrical or electronic signal, characteristics of that signal may be lost. Simply put if background noise is too great as compared to the strength of a signal, the signal may not be discernable. As such, the effects of signal distortion and reduced signal to noise ratio individually or when combined may cause an amplifier not to function properly for an intended use.

A "Low Noise Amplifier" (LNA) is an electronic amplifier that amplifies a very low-power or a low-level signal without significantly impacting its signal-to-noise ratio. Commonly a low noise amplifier increases both the power of a signal and noise present at an input of the amplifier. A low noise amplifier circuit may also introduce additional electrical noise that was not present at the input of the amplifier. LNAs are found in in many market applications, such as radio communications systems, medical instruments, and electronic test equipment. A typical LNA can supply a power gain of 100 (20 decibels (dB)) while decreasing the signal-to-noise ratio by less than a factor of two (a 3 dB noise figure (NF)). Although LNAs are primarily concerned with optimizing weak signals that are just above a noise level, LNA designers must also consider the presence of larger signals that may cause an amplifier to change or distort a signal.

LNAs are used in communications receivers such as in cellular telephones, GPS receivers, wireless LANs (Wi-Fi), and satellite communications. In satellite communications systems, a ground station receiving antenna is coupled to an LNA to amplify weak received signals such that data may be extracted from that signal. Satellite signals commonly are weak because of factors that include distance or limited available power to transmit a signal from a satellite, for example. Since the strength of a transmitted signal reduces geometrically by distance, the farther away a received is from a transmitter, the weaker a received signal will be. Satellites in low earth orbit commonly transmit signals to receivers that are over 200 km (120 miles) away from the transmitter, satellites in a geosynchronous orbit transmit signals that are at least 35,786 km (22,236 miles) away from a receiver. This means that an LNA must amplify signals received by an antenna to increase the power of that signal such that data may be extracted from the signal.

Electrical noise may also come from various sources that include inherent background radiation, manmade or natural electromagnetic disturbances, atmospheric conditions, the presence of obstacles between a transmitter and receiver, or noise may be generated by components included in an amplification circuit. Manmade electrical noise may come from electrical or electronic devices as those devices function or as they are turned on or off.

LNAs are becoming increasingly popular for enhancing the performance of software-defined radio (SDR) receiver systems. SDRs are typically designed to be general purpose use, where amounts of noise associated with a signal may not be optimal for any one particular application. With a LNA and appropriate electrical or electronic filters, the sensitivity and performance of a receiver can be greatly enhanced.

Reducing extraneous electrical noise in a low noise amplifier is essential to producing a low noise amplifier suitable for highly sensitive applications. This is challenging due to the numerous variable factors which can contribute to increasing electrical noise. Even the shape of features of a circuit or a gate of a transistor, a capacitor, or a resistor may affect an amount of noise induced into a signal from an amplifying circuit.

Conventional approaches to reducing noise in an amplifier include following certain design rules or performing simulations, or tuning the amplifier. These conventional approaches, however have significant limitations. For example, design rules may not consider factors associated with a particular type of transmission, or simulations may not accurately model real world conditions or circumstances.

In some instances, simulation software may indicate that the design is not possible, despite the contrary being true. This is because the current software simulation models may not include many capacitances, inductances, or resistances that may be associated with the shapes of electronic components (e.g. transistors, resistors, or capacitors), distances between components, wiring that electrically connects those components, or other factors associated with an amplifier (e.g. number of circuit layers, insulation, or electrical grounds).

A highly sensitive low noise amplifier is essential in applications ranging from scientific research, to cryptographic transmission, wireless and satellite communications, and high definition audio systems. In these applications, traditional low noise amplifiers may either amplify received or induced noise. Even filters that are designed to filter out unwanted noise may not be as effective as desired or required.

Problems with the present technology include an inability to adequately mitigate noise and an inability to provide a consistent (i.e. an even or flat) gain over a range of frequencies. Other problems that present low noise amplifiers suffer from include unacceptable levels of signal distortion, additive noise, and excessive Johnson (thermal) noise.

What are needed are new design techniques and new amplifier circuits that reduce noise or that increase a signal to noise ratio in a manner that is suited for particular applications.

SUMMARY OF THE PRESENTLY CLAIMED INVENTION

The presently claimed invention is directed to apparatus that amplifies signals and to methods for making amplifiers that include field effect transistors connected in parallel configuration. In a first embodiment an amplifier may include an input and a first field effect transistor (FET) of a first amplifier stage, where the first FET is disposed on a substrate and were a first wire electrically connects the input to a first interconnect of the FET. The first stage of the amplifier may also include a second wire that electrically connects a second interconnect of the first FET to a first electrical conductor. The first stage of the amplifier may also include a second FET disposed on the substrate, where a third wire electrically connects the input to a first interconnect of the second FET. The first stage of the amplifier may also include a fourth wire that electrically connects a second interconnect of the second FET to the first electrical conductor. A signal received via the input may be passed through the first FET based on the electrical connections formed by the first wire and the second wire. The signal may also be passed through the second FET based on the electrical connections formed by the third wire and the fourth wire.

In a second embodiment, an amplifier may include a substrate, an input that receives a signal, a first amplification stage located at the substrate, and an electrical conductor. The first amplification stage may include a first field effect transistor (FET) and a second FET that are arranged in a parallel configuration. The input may be coupled to the first amplification stage and the electrical conductor may be coupled to the first and the second FET, where the signal received at the input may be passed through the first and the second FET to the electrical conductor.

In a third embodiment, a method of the present disclosure may include providing a substrate, identifying a first set of components to connect to a first transistor at the substrate, and identifying a second set of components to connect to a second transistor at the substrate. This method may also include attaching a first set of electrical connections that connect the first set of components to the first transistor and attaching a second set of electrical connections that connect the second set of components to the second transistor, where the first set and the second set of attached electrical connections form a parallel circuit of a first amplification stage that includes the first transistor and the second transistor.

BRIEF DESCRIPTIONS OF THE DRAWINGS

DETAILED DESCRIPTION

Figure 1:
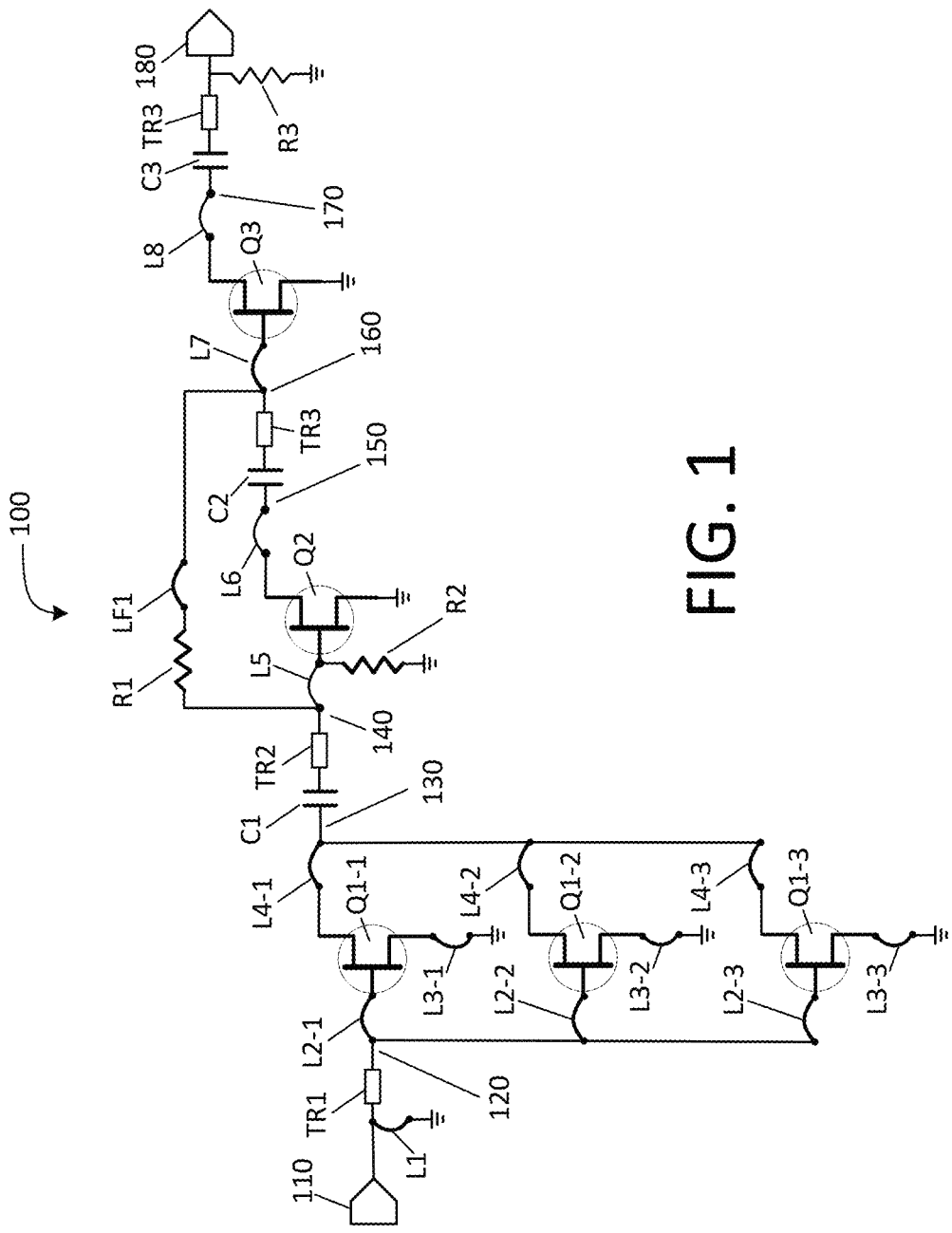
FIG. 1 illustrates circuits of a three-stage amplifier that includes a set of field effect transistors connected in a parallel configuration.

The present disclosure is directed to low noise amplifiers built as a monolithic millimeter or microwave integrated circuit (MMIC) that includes an amplification stage with two or more field effect transistors (FETS) connected in a parallel configuration. An amplifier may include two, three, or more amplification stages. Amplifiers consistent with the present disclosure may operate at frequencies in the range of 3 gigahertz (GHz) to 9 GHz. Each transistor or amplification stage may include their own series feedback element. A second amplification stage may include two parallel transistors, with one having a series feedback element and a feedback shunt spanning the second stage. A third stage may include a single transistor. Each of the transistors connected in a parallel configuration may be tuned to a different corner frequency in order to improve metrics of noise figure, gain, input return loss, and output return loss not possible with conventional amplifier designs.

Techniques used to design a low noise amplifier (LNA) include modifying metallization shapes of wiring or components included in an amplifier, adjusting positions or orientations of amplifier components, changing the physical sizes of components, selecting low-noise components or high performance materials, optimizing circuit operating points, adjusting circuit topologies or layouts, adjusting stray inductance or capacitance, and impedance matching. These design techniques may each be associated with optimizing gain, reaching an acceptable noise level or figure, and controlling liner or non-linear amplifier performance. Substrates that the amplifier may be built on or within may include any type of substrate material using any type of field effect transistor (FET) known in the art, including, yet not limited to gallium arsenide (GaAs), indium phosphide (InP), and indium gallium phosphide (InGaP) materials/FETs. The parallel transistor configurations discussed within improve fundamental operating characteristics of amplifiers built using any type of substrate material or materials used to fabricate the FETs in the amplifier.

The present disclosure is generally related to microwave and millimeter wave monolithic integrated circuits (MMIC), and more particularly to improving the noise figure and return loss performance of low noise receiver amplifiers. The present disclosure is also directed to protecting amplifiers from excessive RF input power, spike leakage, and electromagnetic pulses. Circuit topologies described in this disclosure result in numerous other improvements to amplifier circuits that may also include reduced input and output return loss. When used in combination with selected transistor parameters, such circuit topologies improve the performance of amplification circuits.

The terms "noise figure" or "noise factor," relate to measurements or values of degradation of the signal-to-noise ratio in an electrical circuit caused by the circuits or components of an amplifier circuit. The noise figure is used to evaluate the performance of an amplifier or radio receiver. Lower noise figure values are typically associated with better amplifier performance. The lower the noise figure, the less noise that is introduced into the signal by hardware included in an amplifier circuit.

FIG. 1 illustrates circuits of a three-stage amplifier that includes a set of field effect transistors connected in a parallel configuration. The amplifier 100 of FIG. 1 helps minimize a degradation of signal-to noise ratio of an amplifier, controls the "flatness" of amplifier gain over a range of frequencies, minimizes circuit control loss, and reduces effects of the 1/F corner frequency that tends to limit the performance of conventional low noise amplifiers. The amplifier of FIG. 1 is a low noise amplifier built as an integrated circuit or micro-chip module, such as a monolithic millimeter-wave or monolithic microwave (MMIC) device.

FIG. 1 includes signal input source 110 that may be a connector that may be connected to a test measurement system or an antenna. Connector 110 may be a coaxial connector or other connector standard in the art. Frequencies of a signal provided to input 110 may range from 10 million hertz (megahertz/MHz) to about 40 gigahertz (GHz), for example. Electrical components connected to input 110 include inductor L1 and transmission line TR1. Inductor L1 and other inductors illustrated in FIG. 1 are each identified by an item number that includes the capital letter "L." Each of the different inductors illustrated in FIG. 1 may simply be a length or loop of wire, where an inductance of a particular inductor may correspond to a wire gauge (diameter) and a length of the wire. Inductances of each of the different inductors illustrated in FIG. 1 may be selected when the amplifier of FIG. 1 is designed. Transmission line TR1 and other transmission lines illustrated in FIG. 1 may be designed to have specific impedance characteristics. For example, TR1 may have an impedance of 50 ohms at a frequency where the MMIC amplifier of FIG. 1 operates. Each of the transmission lines of FIG. 1 may be a micro-strip that includes an electrical conductor that may be located within a proximal distance of a ground located on a portion of the MMIC. For example, each of the transmission lines may be built into or onto an integrated circuit substrate. An impedance associated with inductor L1 and transmission line TR-1 may be adjusted to match an input impedance associated with a first stage amplification circuit that includes three different field effect (FET) transistors arranged in a parallel configuration.

Once the input signal passes through transmission line TR1, it is provided to the first stage amplification circuit of amplifier 100 that includes inputs to three different transistor circuits that are arranged in a parallel configuration. The first stage amplifier circuit of FIG. 1 may be considered as beginning at point 120 of FIG. 1 and ending at point 130 of FIG. 1. A first of the three different parallel circuits in this first amplifier stage includes inductor L2-1, transistor Q1-1, inductor L3-1, and inductor L4-1. A second of these three different parallel circuits includes inductor L2-2, transistor Q1-2, inductor L3-2, and inductor L4-2. A third of these three different parallel circuits includes inductor L2-3, transistor Q1-3, inductor L3-3, and inductor L4-3.

The various inductances of these parallel circuits may be selected during a tuning process that adjusts input return loss and a noise figure that may be associated with a minimum operating frequency of the low noise amplifier of FIG. 1. Inductors L3-1, L3-2, and L3-3 may be referred to as feedback elements associated with FET transistors Q1-1, Q1-2, and Q1-3 and with modeling equations that identify how impedances associated with inductors L3-1, L3-2, and L3-3 are reflected back to inputs of FET transistors Q1-1, Q1-2, and Q1-3. The inputs of inputs of Q1-1, Q1-2, and Q1-3 are a "gate" interconnect of each of these respective FET transistors that are located respectively where L2-1 connects to Q1-1, where L2-2 connects to Q1-2, and where L2-3 connects to Q1-3.

FET transistor Q1-1 includes a "source" interconnect connected to a first end of inductor L3-1, where a second end of inductor L3-1 is connected to a ground of amplifier 100. FET transistor Q1-2 includes a "drain" interconnect connected to a first end of inductor L4-1, where a second end of inductor L4-1 connects to capacitor C1 (point 130 of FIG. 1). FET transistor Q1-2 includes a "source" interconnect connected to a first end of inductor L3-2, where a second end of inductor L3-2 is connected to a ground of amplifier 100. FET transistor Q1-2 includes a "drain" interconnect connected to a first end of inductor LA-2, where a second end of inductor L4-2 also connects to capacitor C1 (point 130 of FIG. 1). FET transistor Q1-3 includes a "source" interconnect connected to a first end of inductor L3-3, where a second end of inductor L3-3 is connected to a ground of amplifier 100. FET transistor Q1-3 includes a "drain" interconnect connected to a first end of inductor L4-3, where a second end of inductor L4-3 also connects to capacitor C1 (point 130 of FIG. 1). Connections between LA-1, L4-2, L4-3, and capacitor C1 may also include a conductor disposed on a surface of an MMIC. By arranging the three different transistors Q1-1, Q1-2, and Q1-3 in parallel, an "effective width" of a "gate" associated with the first amplifier stage of amplifier 100 is increased. As mentioned above point 130 of FIG. 1 may be considered to be a location where the first stage amplifier circuit ends.

The parallel arrangement of the elements with selected impedances (i.e. the inductors) of this first amplification stage aid in matching both the input impedance and the output impedance of the first amplifier stage to be flat over a longer span of frequencies than is possible in an instance when only one FET is used in such a first amplification stage. This arrangement improves the signal-to-noise ratio, extends the "flatness" of gain, and minimizes circuit control loss of the amplifier of FIG. 1 while reducing negative effects of corner effects (e.g. 1/F gain reduction) associated with conventional amplifiers. The parallel configuration of the transistors in this first amplification stage also may increase the frequency range over with amplifier 100 operates. This may include lowering the operational frequency of a similar amplifier that does not include parallel transistors in an amplification stage. In certain instances, the increasing of the "effective gate width" of the parallel transistors Q1-1, Q1-2, and Q1-3 may be designed to lower a frequency of operation of an amplifier while reducing a maximum high operational frequency of such an amplifier. The parallel transistors (Q1-1, Q1-2, & Q1-3) may each be tuned to different corner frequencies to maintain flatness of gain while maintaining a signal-to-noise ratio. The gains versus frequency of transistors Q1-1, Q1-2, and Q1-3 may be adjusted by changing respective inductance values of the inductors connected to Q1-1, Q1-2, and Q1-3.

The signal from the first amplification stage is passed to a second amplification stage via coupling capacitor C1 and transmission line TR2. Capacitor C1 and transmission line TR2 may be considered inter-stage components that help match an impedance associated with the first amplification stage with an impedance associated with the second amplification state. The second amplification stage may be considered as beginning at point 140 and ending at point 150 of FIG. 1. The second amplification stage may include inductor L5, transistor Q2, and inductor L6. Components such as resistor R2, resistor R1, & inductor LF1 may also be considered components of the second amplification stage or be considered components that provide negative feedback to help stabilize operation of amplifier 100. While not illustrated in FIG. 1, a source interconnect of transistor Q2 may be coupled to an inductor instead of being coupled directly to ground as illustrated. A drain interconnect of transistor Q2 of FIG. 1 connects transistor Q2 to a first end of inductor L6 and a second end of inductor L6 connects to capacitor C2.

Capacitor C2 and transmission line TR3 may be considered components that couple signal to a third amplification stage of FIG. 1 that may be considered as beginning at point 160 and ending at point 170 of FIG. 1. As such, this third amplifier stage may include inductor L7, transistor Q3, and inductor L8. Capacitor C3, transmission line TR3, and resistor R3 may be considered components that couple an amplified signal to output 180.

As mentioned above the various inductors discussed in respect to FIG. 1 may be wires that act as inductors based on their gauge and/or length, where inductances of each of these inductors may be adjusted to tune operation characteristics of one or more stages of the amplifier 100 of FIG. 1. The amplifier of FIG. 1 may be a low noise amplifier comprising multiple parallel transistors laid out on, coupled to, or built into a MMIC substrate A circuit similar to the amplifier 100 circuit of FIG. 1 that does not include multiple parallel transistors would have inferior operational characteristics as compared to the amplifier 100. The amplifier 100 of FIG. may be tuned in ways that a conventionally designed amplifier cannot be partly because each of a set of parallel transistors may be tuned to have different frequency response characteristics to maintain a gain over a span of frequencies that is larger than possible using amplifier stages that each include a single transistor. For Example, Q1-1 and related components may be tuned to pass frequencies F1 through F10, Q1-2 and related components may be tuned to pass frequencies F5 through F15, and Q1-3 may be tuned to pass frequencies F10 through F20 in order to maintain a desired flatness of gain over of all or a subset of frequencies F1 through F20. In such an instance, the second stage and the third stage amplifiers may be tuned to provide additional signal gain.

While the beginning and ending points of various amplification stages have been described to be located at various specific points (120/130, 140/160, & 160/170) of FIG. 1, one of ordinary skill in the art at the time of the invention would understand that the beginning and end points of a particular amplifier stage could be considered to be located at points that are slightly different in a given analysis or simulation. For example, the beginning/end points of the first amplification stage could be points 110/130 respectively, the beginning/end points of the second amplification stage could include points 130/150 respectively, and beginning/end points of the third amplification stage could include points 150/180 of FIG. 1. Each respective stage could include one or more transistors and a set of other components, where an amplified signal may pass from one amplification stage to another via one or more electrical contact(s), connection(s), transmission line(s), or component(s).

Each circuit element may be chosen, using a method of tuning an amplifier comprising the steps of first building the circuit and performing real world simulations and adjusting parameters. Parameters that may be adjusted may include wire length, wire gauge, or type of material. This tuning process may include repeating simulations while observing changes and trends in measured parametric data collected from real-world experiments. Parameters may be selected to adjust gain flatness over a desired frequency range, to meet a desired noise figure, or both. For instance, inductor L1 or other inductors of FIG. 1 may be wires of selected lengths and cross-sectional area(s) and a model designed to forecast performance considering these lengths and areas may be used to estimate performance of the amplifier. Simulated data may then be compared to data collected using circuits and real-world measurements. Coefficients in the model may be adjusted to help improve the model after which wire lengths, gauges, or materials may be changed in the model, additional estimates may be generated, fabricated circuits may be updated to correspond to the modeled configuration, and additional real-world data may be collected. These methods may be iterated to improve the model to account for each element in the amplifier circuit.

This process may include generating estimates for each transistor or amplification stage of an amplifier circuit. The process may also include changing types of transistors, (e.g. GaAs or InP FETS) or different transistor feature sizes or topologies may be used. As such, the design of a given amplifier may include different sizes, shapes, gate features (e.g. lengths, heights, widths), source features (e.g. lengths, heights, widths), and/or drain features (e.g. lengths, heights, widths). Other items that may be modified may include ion-implant depth of different semiconductor materials or relative sizes or topologies of one transistor part to another transistor part (source, gate, or drain). Here again real-world experimental data may be compared to modeled data to improve the model or to design an amplifier. A number of transistors in parallel in any stage can be varied when a circuit is designed or optimized. The number of transistors may then be selected along with the adjustment of their associated tuning elements.

The use of field effect transistors (FETs) allows for a parallel configuration of transistors allow signals to be amplified without changing a phase or inversion of an input signal as would occur if bipolar transistors were connected in a parallel configuration and may use fewer transistors as compared to a bipolar transistor differential amplifier with transistors in a parallel configuration.

Figure 2:
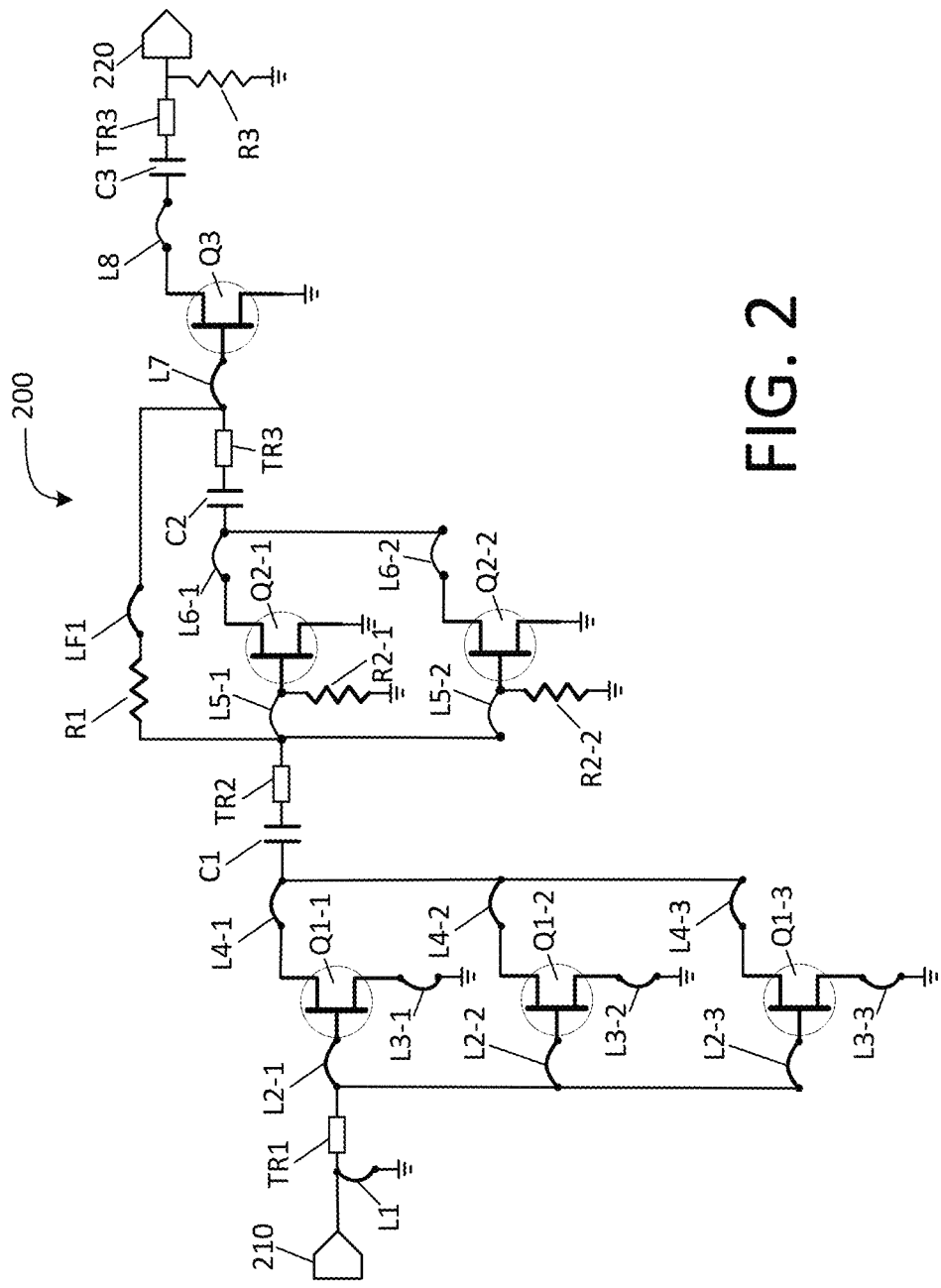
FIG. 2 illustrates an amplifier circuit that includes two stages of field effect transistors connected in a parallel configuration.

FIG. 2 illustrates an amplifier circuit that includes two stages of field effect transistors connected in a parallel configuration. The amplifier 200 of FIG. 2. FIG. 2 includes many of the same components as FIG. 1 that perform functions consistent with the various amplifier stages, coupling, and feedback components of amplifier 100 of FIG. 1. FIG. 1 includes input connector 210 (that receives an input signal), inductor L1 and transmission line TR1 that pass the input signal to a first stage amplifier. Here again the first stage amplifier consists of three different transistor circuits connected in parallel. The components of this first stage amplifier also include inductors (L2-1, L2-2, L2-3, L3-1, L3-2, L3-3, LA-1, L4-2, L4-3) and FET transistors Q1-1, Q1-2, and Q1-3. This first amplifier stage is coupled to a second amplifier stage via capacitor C1 and transmission line TR2. This second amplification stage includes two different transistor circuits connected in parallel. A first transistor circuit of this second amplification stage includes inductor L5-1, Q2-1, and inductor L6-1. A second transistor circuit of this second amplification stage includes inductor L5-2, Q2-2, and inductor L6-2. Resistors R2-1 and R2-2 as well as resistor R1 and inductor LF1 may act as feedback that affect the operation of the second amplification stage of FIG. 2. Capacitor C2 and transmission line TR3 may be considered components that couple signal to a third amplification stage of FIG. 2 that includes inductor L7, transistor Q3, and inductor L8. Capacitor C1, transmission line TR3, and resistor R3 may be considered as components that couple signal to output 220 of FIG. 2. While not illustrated in FIG. 2, source interconnects of transistors Q2-1 and Q2-2 may be coupled to other components (e.g. respective inductors) instead of being directly connected to ground as illustrated.

The use of two different amplification stages where each of these stages include a set of parallel transistor circuits may be used to further tune the operation of an amplifier circuit. One benefit that such a configuration may provide is the ability to further lower a frequency of operation of the amplifier. Such a configuration may provide both the ability to pass a larger frequency range while maintain signal strengths within that larger frequency range within a desired variance. Such a configuration may also allow amplifier circuits to be built that both lower an operational frequency while maintaining amplifier performance at higher frequencies. Methods and circuit topologies of the present disclosure, thus provide a designer with the ability to optimize the operation of amplifier circuits to meet the requirements of modern telephone, telecom, satellite, and ground and/or space based communication equipment.

Figure 3A:
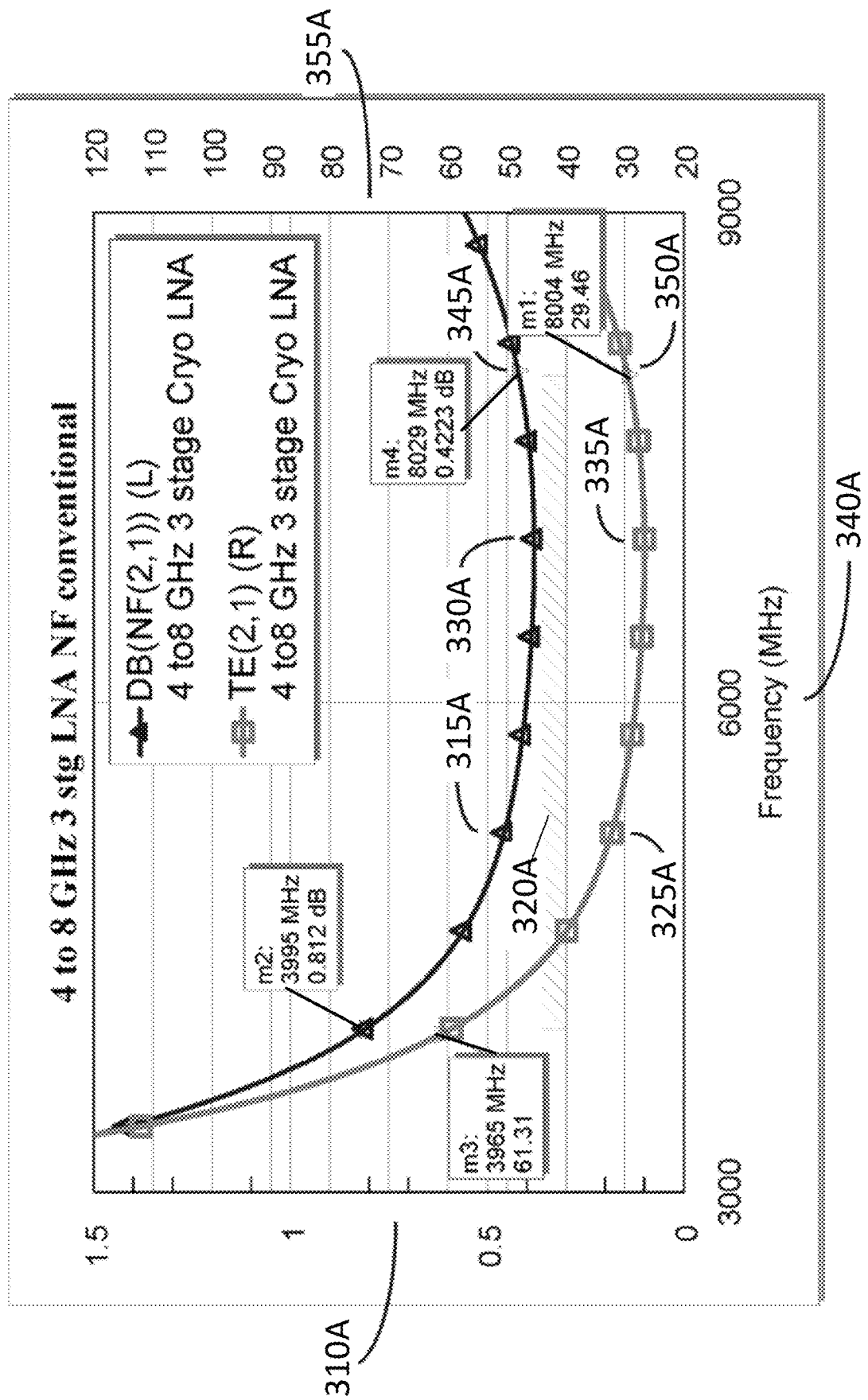
FIG. 3A illustrates noise figures associated with an amplifier that does not include field effect transistors connected in a parallel configuration.

FIG. 3A illustrates noise figures associated with an amplifier that does not include field effect transistors connected in a parallel configuration. FIG. 3A includes both an X axis that corresponds to frequency and a Y axis that corresponds to noise figure over frequency range 340A. The X axis of FIG. 3A ranges from 3000 megahertz (MHz) to 9000 MHz, or put in terms of gigahertz (GHz) 3 GHz to 9 GHz. The Y axis or noise figure axis of FIG. 3A has two different scales, a first scale 310A on the left side of FIG. 3A that corresponds to decibels (dB) and a second scale 355A of the right side of FIG. 3A that corresponds to noise figure expresses in Kelvin noise temperature. Note that the X axis of FIG. 3A is a linear scale and that the Y axes of FIG. 3A have logarithmic scales.

The top curve 330A of FIG. 3A illustrates noise figure in dB versus frequency (F) measured for a particular conventional amplifier. The bottom graph of FIG. 3A illustrates noise figure in Kelvin (K) versus frequency F for the particular amplifier. A formula for converting noise figure in dB to noise figure in K may be represented as NF (dB)=10 Log$_{10}$ [(noise-Temp/ref-Temp)+1)]. At room temperature of 25 C or 298.15 K this formula corresponds to NF (dB) 10 Log$_{10}$ [(noise-Temp/298.15)+1.

The top curve 330A of FIG. 3A includes triangular identifiers and several sample points, where some of these sample points correspond to identifiers m2, 315A, 345A, and m4. Note that point m2 is associated with a frequency of 3995 MHz and a noise figure of 0.812 dB and that point m4 is associated with a frequency of 8029 MHz and a noise figure of 0.4233 dB. Points 315A and 345A of top curve 330A are corner frequencies of the amplifier.

The bottom curve 335A of FIG. 3A includes square identifiers and several sample points, where some of these sample points correspond to identifiers m3, 325A, 350A, and m1. Point m3 is associated with a frequency of 3965 MHz and a noise temperature of 61.31 Kelvin and point m1 is associated with a frequency of 8004 MHz and a noise temperature of 29.46 Kelvin.

The zone associated with the set of hashed lines 320A illustrates an area of FIG. 3A that may be referred to as an ideal or reference operational noise figure/frequency zone of operation of an amplifier. In certain instances, an amplifier that operates within the zone of hashed lines 320A noise figure/frequency zone for a given range of operational frequencies may be considered as an amplifier that operates adequately for a given application.

Note the shape of the curves of FIG. 3A since the vertical Y axis of FIG. 3A has a logarithmic scale, changes in the noise figure versus frequency in reality are very dramatic as compared to what a casual observer might realize by quickly looking at the graph. The curves of FIG. 3A show that conventional amplifiers built without transistors connected in a parallel configuration have noise figures that change by orders of magnitude as frequencies change between 3000 MHz and 9000 MHz.

Figure 3B:
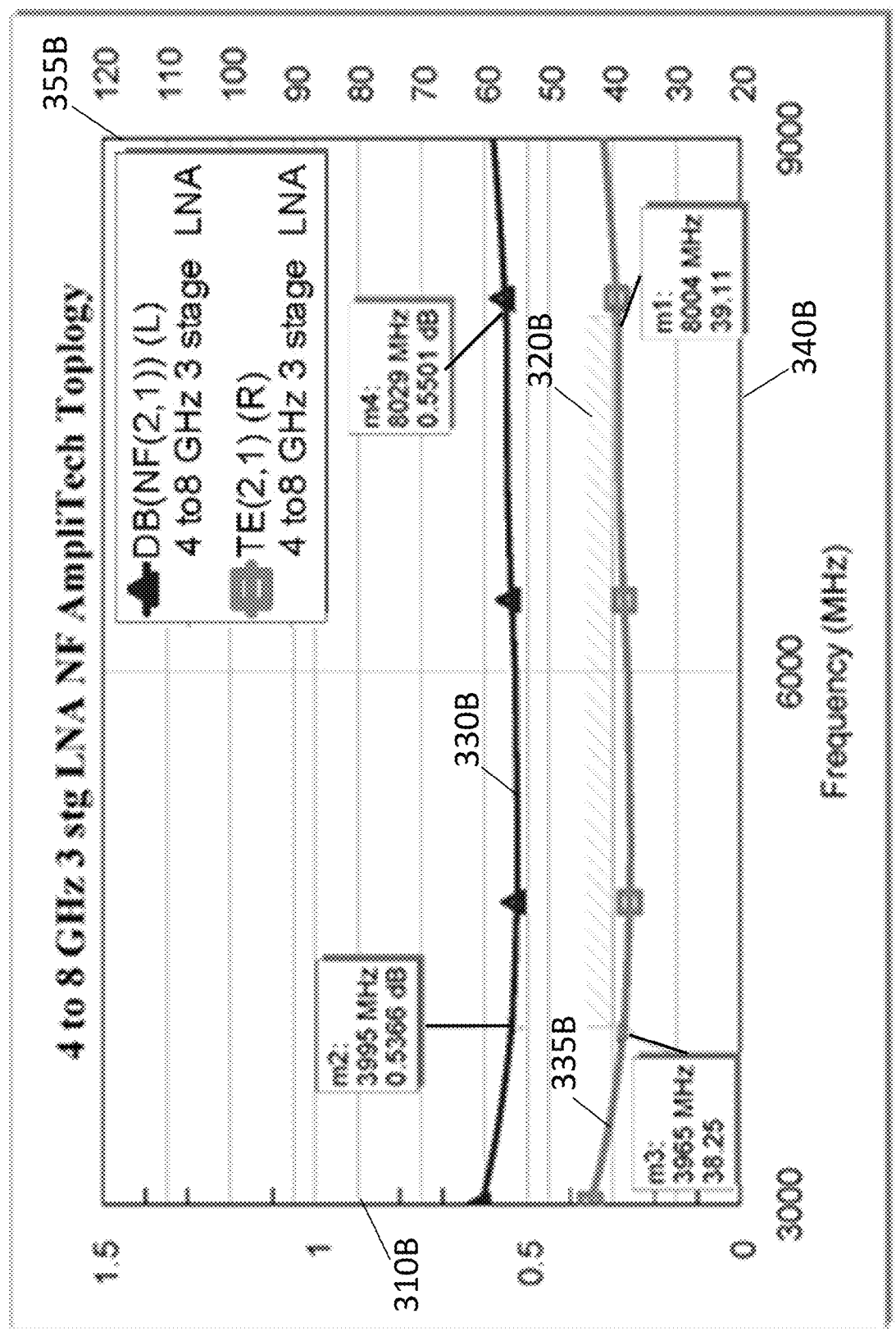
FIG. 3B illustrates noise figures associated with an amplifier that includes field effect transistors connected in a parallel configuration.

FIG. 3B illustrates noise figures associated with an amplifier that includes field effect transistors connected in a parallel configuration. Here again two different curves are illustrated, a top curve 330B that includes triangle shaped points and a bottom curve 335B that includes square shaped points. FIG. 3B includes an X axis 340B (frequency in MHz) and X axes 310B in dB & 355B in Kelvin Note that curves of FIG. 3B are much flatter than the curves of FIG. 3A. This shows that the parallel FET circuit configurations of FIGS. 1-2 dramatically improve noise figure performance in frequency ranges between 3000 MHz and 9000 MHz.

Items m2 and m4 illustrate that noise figure for an amplifier of the top curve 330B of FIG. 3B at 3995 MHz has a value of 0.5366 dB and has a noise figure at 8029 MHz has a value of 0.5501 dB. Points m2 and m4 correspond to points at the upper curve 330B that are within a frequency range identified by the hashed lines 320B of FIG. 3B. Within this range, the noise figure for an amplifier of the top curve 330B of FIG. 3B changes only by 0.0135 dB.

Items m3 and m1 in FIG. 3B illustrate that noise figure for an amplifier at 3965 MHz has a value of 38.2 Kelvin and a noise figure at 8004 MHz has a value of 39.1 Kelvin. Points m3 and m1 correspond to points of the lower curve 335B that are within a frequency range identified by the hashed lines 320B of FIG. 3B. Within this range noise figure for an amplifier of the bottom curve 335B of FIG. 3B changes only by 1.1 Kelvin.

When differences in values of noise figure of FIG. 3B associated with points m2/m4 (3995 MHz & 8029 MHz) and m3/m1 (3965 MHz & 8004 MHz) are compared to points m2/m4 and m3/m1 of FIG. 3A, changes in values of noise figures of FIG. 3A are much larger than changes in values of noise figures of FIG. 3B. Respectively, FIG. 3A shows changes in noise figure of 0.3897 dB and 31.85 Kelvin; these numbers are much larger than the changes in noise figure of FIG. 3B of 0.0135 dB and 1.1 Kelvin. This demonstrates that the use of parallel FET transistors improves values of noise figure by over an order of magnitude. The improvement is approximately 290% (290% less noise factor variance) for each of curves of FIG. 3A as compared to FIG. 3B.

Figure 4A:
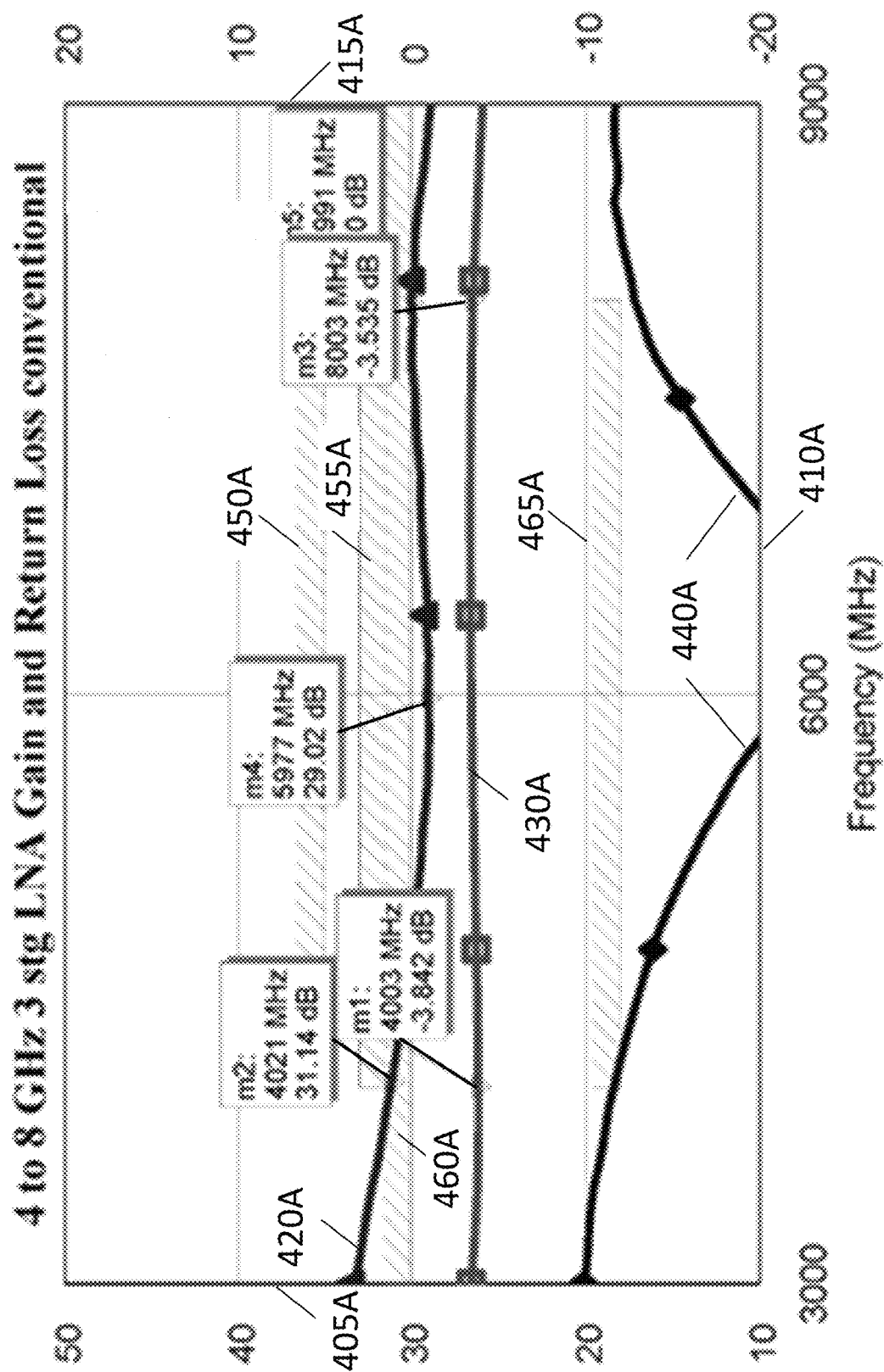
FIG. 4A illustrates measures of gain, input return loss, and output return loss for an amplifier that does not include field effect transistors arranged in a parallel configuration.

FIG. 4A illustrates measures of gain, input return loss, and output return loss for an amplifier that does not include field effect transistors arranged in a parallel configuration. The graphs of FIG. 4A shows plots of input gain 420A, input return loss 430A, and output return loss 440A for an amplifier built with a conventional design. The curves of FIG. 3A and FIG. 4A are associated with the same conventional type of amplifier. FIG. 4A includes an X axis of frequency 410A that ranges from 3000 MHz to 9000 MHz and two different linear Y axes scales 405A in dB and 415A in Kelvin. Hashed line 450A illustrates an upper target gain level over a frequency range of about 4000 MHz to about 8000 MHz and the hashed line 455A illustrates a lower target gain level over this same frequency range (4000 MHz-8000 MHz). These hashed lines indicate that for a given application that the target gain for an amplifier should be between about 32 dB and 37 dB. FIG. 4A shows that this conventional amplifier has a gain that barely meets the minimum target at a frequency of 4000 MHz and that the gain reduces below this minimum target at frequencies above 4000 MHz. What this shows is that the conventional amplifier associated with FIG. 4A would likely not perform very well for a first intended application. FIG. 4A shows gain varying from about 33 dB at 3000 MHz to about 29 dB at 9000 MHz and shows gain for this conventional amplifier at various sample points (point m2 has a gain of 31.41 dB at 4021 MHz and point m4 has a gain of 29.02 at 5977 MHz).

Hashed line 460A may identify a maximum specified amount of input return and output return loss of an amplifier for a first application that operates at frequencies between 3000 MHz and 9000 MHz. Hashed line 465B may correspond to a desired preferred amount of input return loss and output return loss associated with the amplifier when it operates between 4000 MHz and 8000 MHz for that first application. What this means is that to meet requirements of this first application that both input return loss and output return loss curves 420A and 430A must be below values associated with hashed line 460A and preferably should not exceed values associated with hashed line 465A. Curve 430A of FIG. 4A shows an input return loss at point m1 of −3.842 dB below hashed line 460A at 4003 MHz and an input return loss of −3.535 dB below hashed line 460A at 8003 MHz.

FIG. 4A shows that a conventionally designed amplifier would not quite meet gain requirements of the first application. The location of curve 430A shows that this conventional amplifier would have acceptable, yet not preferred levels of input return loss for this first application. Finally, FIG. 4A shows that the convention amplifier has acceptable values of output return loss between frequencies of about 4000 MHz and 8000 MHz because curve 440A is below values associated with curve 465A. All of these factors combined indicate that the conventional amplifier would not be well suited for use in the first application.

Figure 4B:
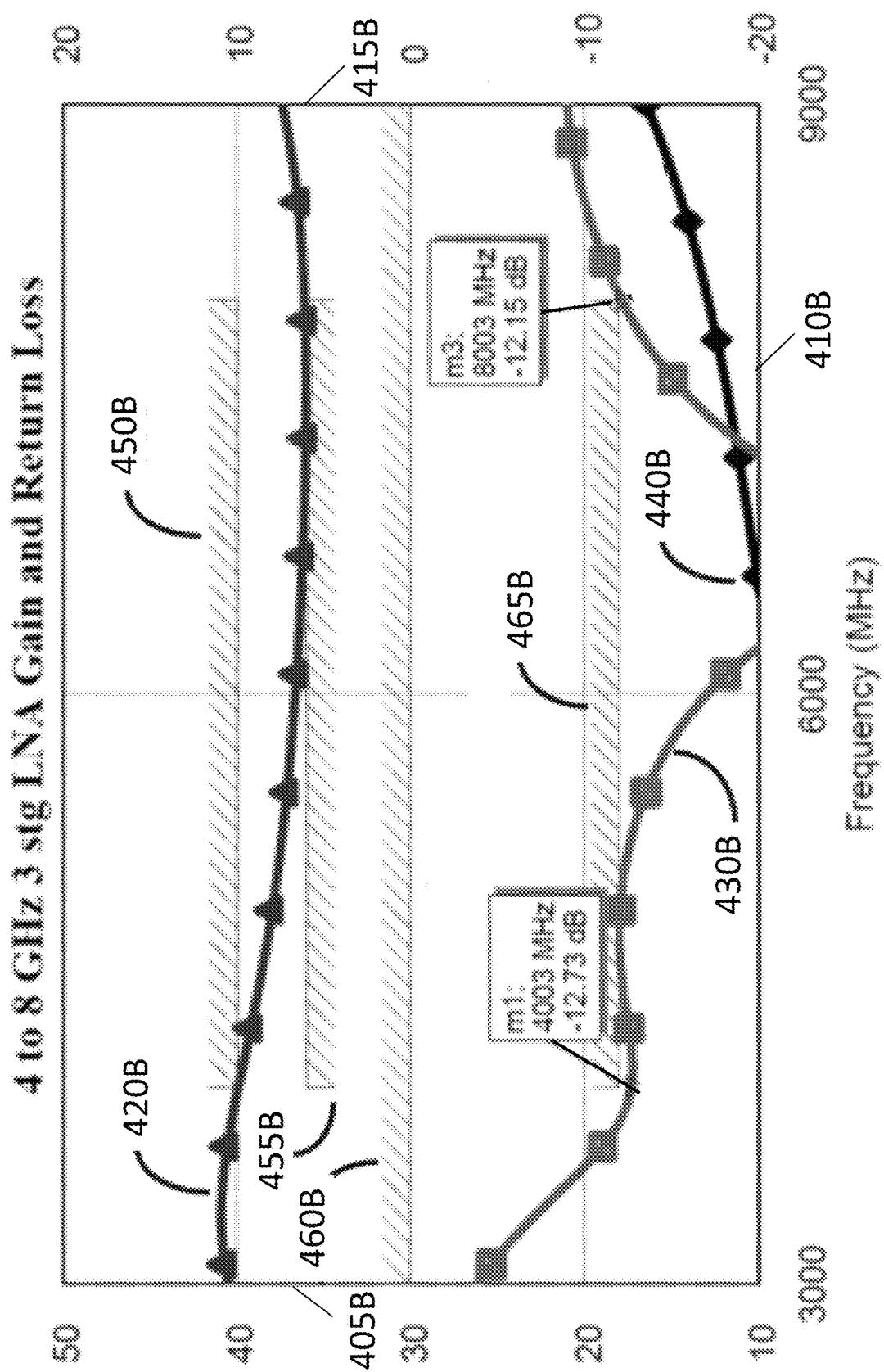
FIG. 4B illustrates measures of gain, input return loss, and output return loss for an amplifier that includes field effect transistors arranged in a parallel configuration.

FIG. 4B illustrates measures of gain, input return loss, and output return loss for an amplifier that includes field effect transistors arranged in a parallel configuration. FIGS. 3B and 4B are associated with a same type of amplifier that includes FETs arranged in a parallel configuration. FIG. 4B includes gain curve 420B that includes the triangle shaped points, input return loss curve 430B that includes the square shaped sample points, and output return loss curve 440B that includes the diamond shaped sample points. FIG. 4 includes both an X axis 410B showing frequencies ranging from 3000 MHz (3 GHZ) to 9000 MHz (9 GHz) and Y axes using two different scales 405B & 415B. Here again the left Y axis scale 405B is a decibel (dB) scale and the right scale Y axis is a scale 415B in Kelvin. Here both the X axis and the Y axis scales are both linear scales.

Note that gains associated with the gain curve vary between about 35 dB to about 42 dB for a second target application. The hashed line 450B illustrates an upper target gain level for over a frequency range of about 4000 MHz to about 8000 MHz and the hashed line 455B illustrates a lower target gain for level over this same frequency range (4000 MHz-8000 MHz). This upper hashed line 420B spans a small range from about 40 dB to about 42 dB and the lower hashed line 455B spans a small range from about 33 dB to about 35 dB. Note that the gain of the parallel transistor amplifier varies from about 40 dB down to about 35 dB in the frequency range of 4000 MHz to 8000 MHz. In an instance where a specification for a gain of an amplifier required (e.g. for the second target application) that a gain located within the range specified by the upper hashed line 450B and the lower hashed line 455B, such a specification would require a minimum gain of about 34 dB and a maximum gain of 42 dB. Since gain curve 402 stays within this range, the parallel transistor amplifier would meet the required gain over the desired frequency range of 4000 MHz to 8000 MHz for this second target application.

Hashed line 460B may represent levels of a maximum amount of input return and output return loss of an amplifier that operates at frequencies between 3000 MHz and 9000 MHz. Hashed line 465B may correspond to a desired maximum preferred amount of input return loss and output return loss associated with the amplifier when it operates between 4000 MHz and 8000 MHz for a given application. Values of input and output return loss within or below levels of hashed line 465B would more than meet requirements of input and output return loss for the second target application. Note that hashed line 460B varies between 30 dB and about 32 dB and that hashed line 465B varies between about 18 dB and 20 dB. Note that the performance of the amplifier meets the required input and output return loss requirements by not exceeding levels indicated by either hashed line 460B or 465B.

The various measures of gain and return loss discussed above in terms of dB correspond to levels of gain and return loss in terms of Kelvin, the correspondence between dB and Kelvin may be identified by referring the different Y axis scales 405B in dB and 415B in Kelvin of FIG. 4B.

The performance curves of FIGS. 3A, 3B, 4A, & 4B show that the amplifier associated with FIGS. 3B & 4B has superior performance in terms of noise figure, gain, input return loss, and output return loss as compared to the amplifier associated with FIGS. 3A & 4A. This data demonstrates that amplifiers built with the parallel configuration illustrated in FIGS. 1-2 have flatter noise figure curves, higher gain, and lower measures of input and output return loss as compared to amplifiers of a conventional design.

Figure 5:
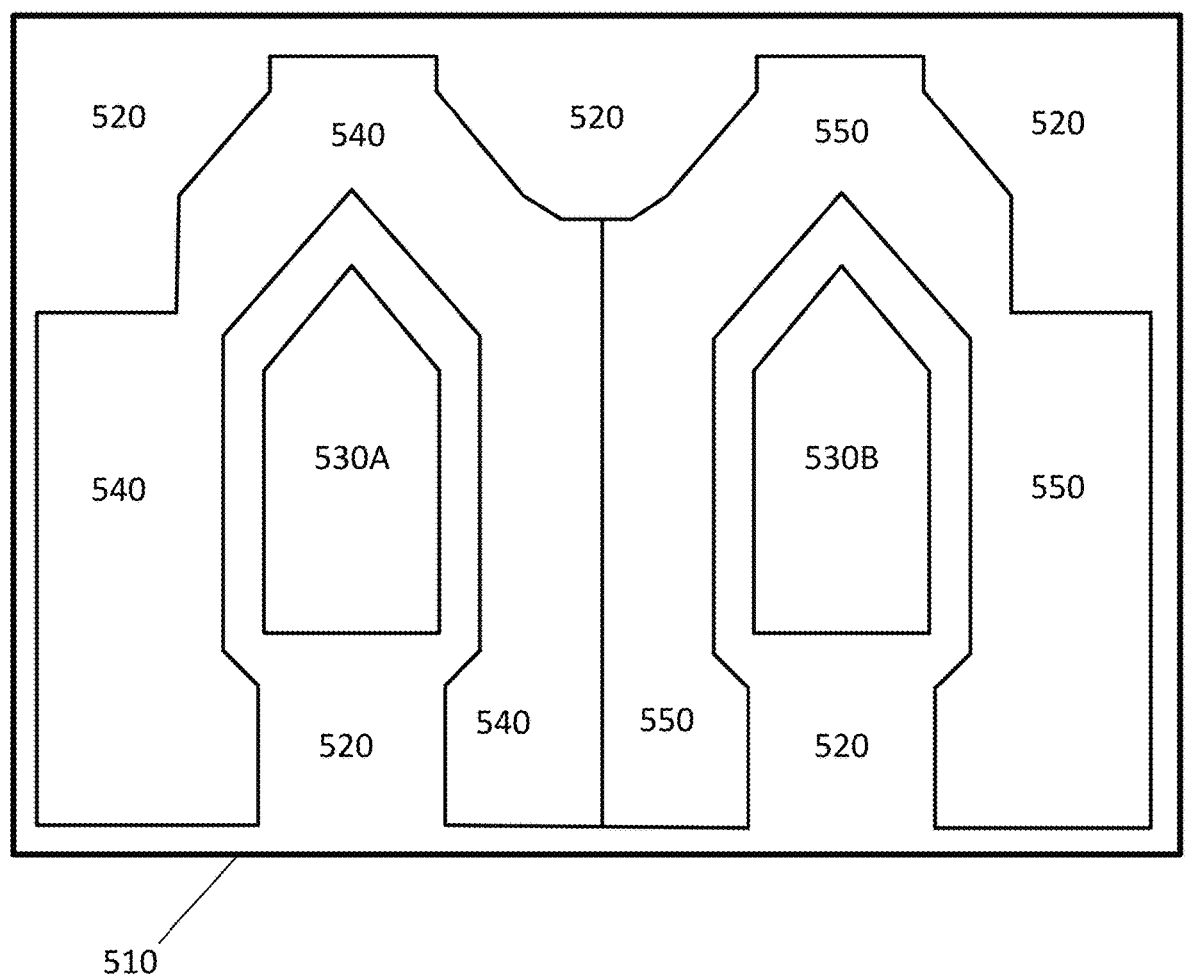
FIG. 5 illustrates a top view of a transistor that may be attached to or incorporated into a monolithic millimeter or microwave integrated circuit.

FIG. 5 illustrates a top view of a transistor that may be attached to or incorporated into a monolithic millimeter or microwave integrated circuit. The millimeter or microwave integrated circuit (MMIC) of FIG. 5 includes transistor 510 of FIG. 5 includes areas 520, 530A, 530B, 540, and 550. Note that FIG. 5 shows that area 520 surrounds each of areas 550, 540, 530A, and 530B. Area 520 may be made of material that may be a semiconductor material, an insulator, or a material with greater resistance than materials located within areas 550, 540, 530A, and 530B. Each of areas 550, 540, 530A, and 530B may include a metallic pad to which wires may be attached or bonded to. Areas 540, 550, 530A, and 530B may be a source, drain, or gate portion of and FET transistor 510 depending on the layout of a particular transistor. Areas 530A and 530B may both be areas were connections to a gate of FET transistor 510 may be attached to. In such an instance area 540 may be an area where connections to a source of the transistor are attached to, and area 550 drain may be an area where connections of a drain of the transistor are attached to. Transistor 510 may be a field effect transistor (FET) of a particular type and each of the transistors of FIGS. 1-2 may be field effect transistors like transistor 510. FET 510 may be a gallium arsenide (GaAs) type, indium phosphide (InP) type, or other type of FET transistor.

Figure 6:
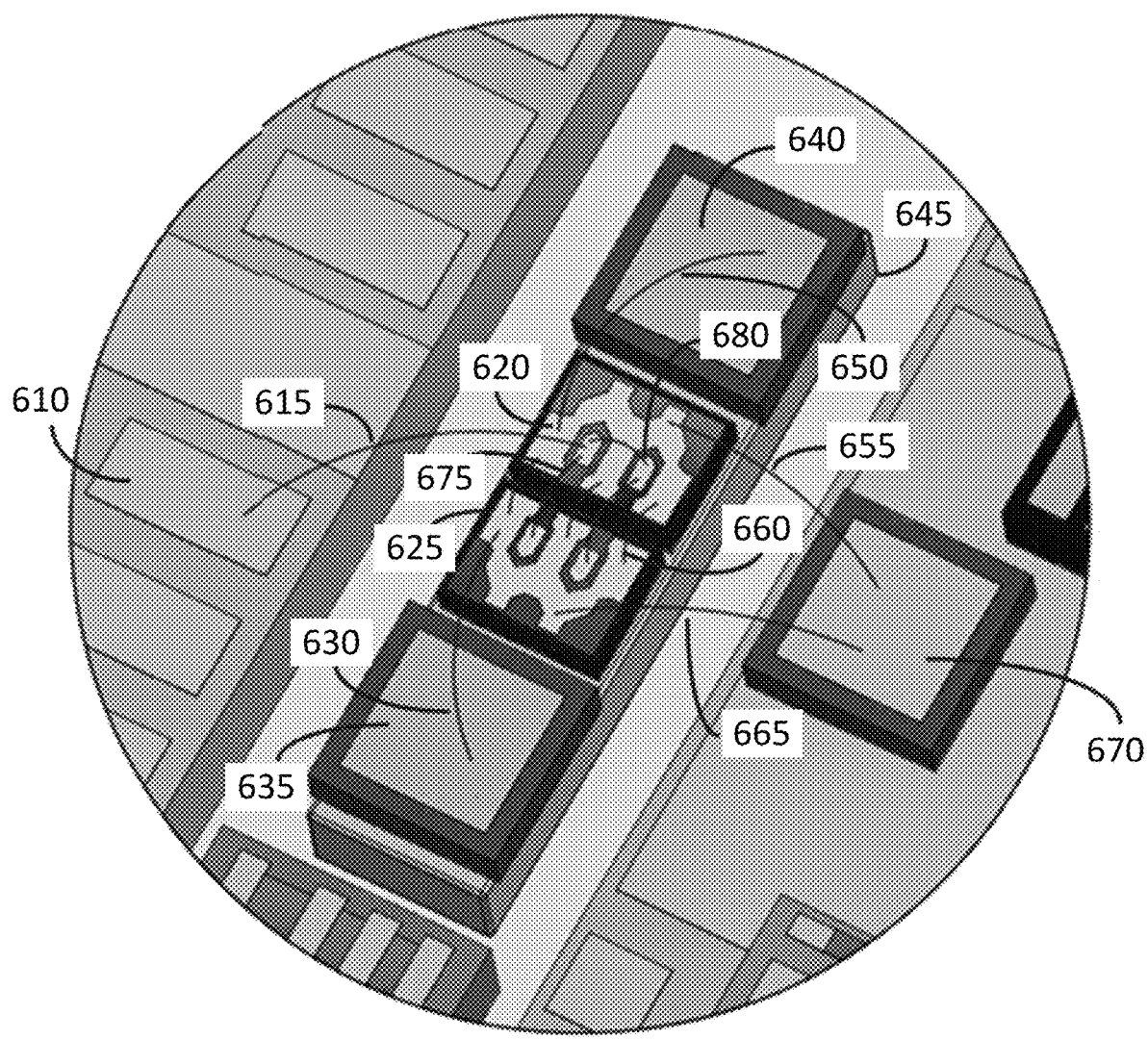
FIG. 6 illustrates a low noise amplifier implemented as a monolithic millimeter or microwave integrated circuit that includes at least two transistors.

FIG. 6 illustrates a low noise amplifier implemented as a monolithic millimeter or microwave integrated circuit that includes at least two transistors. FIG. 6 includes metallization pad 610 (that may be used to connect to outside leads or the other circuits). Metallization pads of a monolithic millimeter or microwave integrated circuit (MMIC) may connect to a power supply input, a ground connection, an antenna, or to an output that leads to the next stage of circuitry. FIG. 6 shows that pad 610 is connected to the gate of a first FET transistor 620 via wire 615. FIG. 6 includes FET transistors 620 and 625 that both have two metalized gate pads, one of which is identified as pad 680. These gate pads are of FIG. 6 are shaped like gate areas 530A and 530B of FIG. 5. Note that FIG. 6 shows a wire that jumps between a first and a second metalized gate contact pads of transistor 620. Note that only some of the metalized pads and wires illustrated in FIG. 6 are numbered in order to make the features of FIG. 6 easier to see. Note also that wires also connect gate portions of transistor 620 and 625 to each other. Only one of these gate to gate wire connections are numbered as 675 of FIG. 6.

Transistors 620 and 625 also include larger metalized areas that are shaped similar to areas 540 and 550 of FIG. 5. Various wires are illustrated in FIG. 6 that connect these larger metalized areas of transistors 620 & 625 together, where only wire 660 is numbered. As discussed in respect to FIG. 5, these larger metalized areas (540 & 550) may respectively be a source interconnect and a drain interconnect of a transistor.

FIG. 6 also includes capacitors 635, 640, and 670, where capacitor 635 is connected to an interconnect (e.g. a source or drain interconnect) of transistor 625 via wire 630 and where capacitor 640 is connected to an interconnect (e.g. a source or drain interconnect) of transistor 620 via wire 650. FIG. 6 also includes wire 655 that connects an interconnect (e.g. a drain or source interconnect) of transistor 620 to capacitor 670 and wire 665 that connects an interconnect (e.g. a drain or source interconnect) of transistor 625 to capacitor 670. Item 645 of FIG. 6 may be a portion of a substrate of MMIC of FIG. 6. Substrate portion 645 may include metallic interconnects, transmission lines, or ground connections.

Various wires connecting to the gate interconnects of transistors 620 and 625 may be similar to the wires L2-1, L2-2, L5, L5-1, and L7-1 discussed in respect to FIGS. 1 and 2. The various wires connected to the source or drain interconnects of transistors 620 and 625 may be similar to the various wires discussed in respect to FIGS. 1-2. FIG. 6 illustrates that more than one wire may connect different features or different parts of a circuit in parallel or serial as desired. This may allow the designer to adjust inductances and/or stray capacitances in a circuit when impedances and related frequency response figures (noise factors, gains, input/out return loss factors) are adjusted. For example, two different wires in parallel may alter a total impedance by varying both capacitance and inductance associated with respective portions of a circuit. While FIG. 6 includes only two transistors, an MMIC similar to the one illustrated in FIG. 6 could include numerous other transistors, capacitors, or strip line transmission lines. The MMIC of FIG. 6 could include all of the components illustrated in FIG. 1 or 2, for example.

Figure 7:
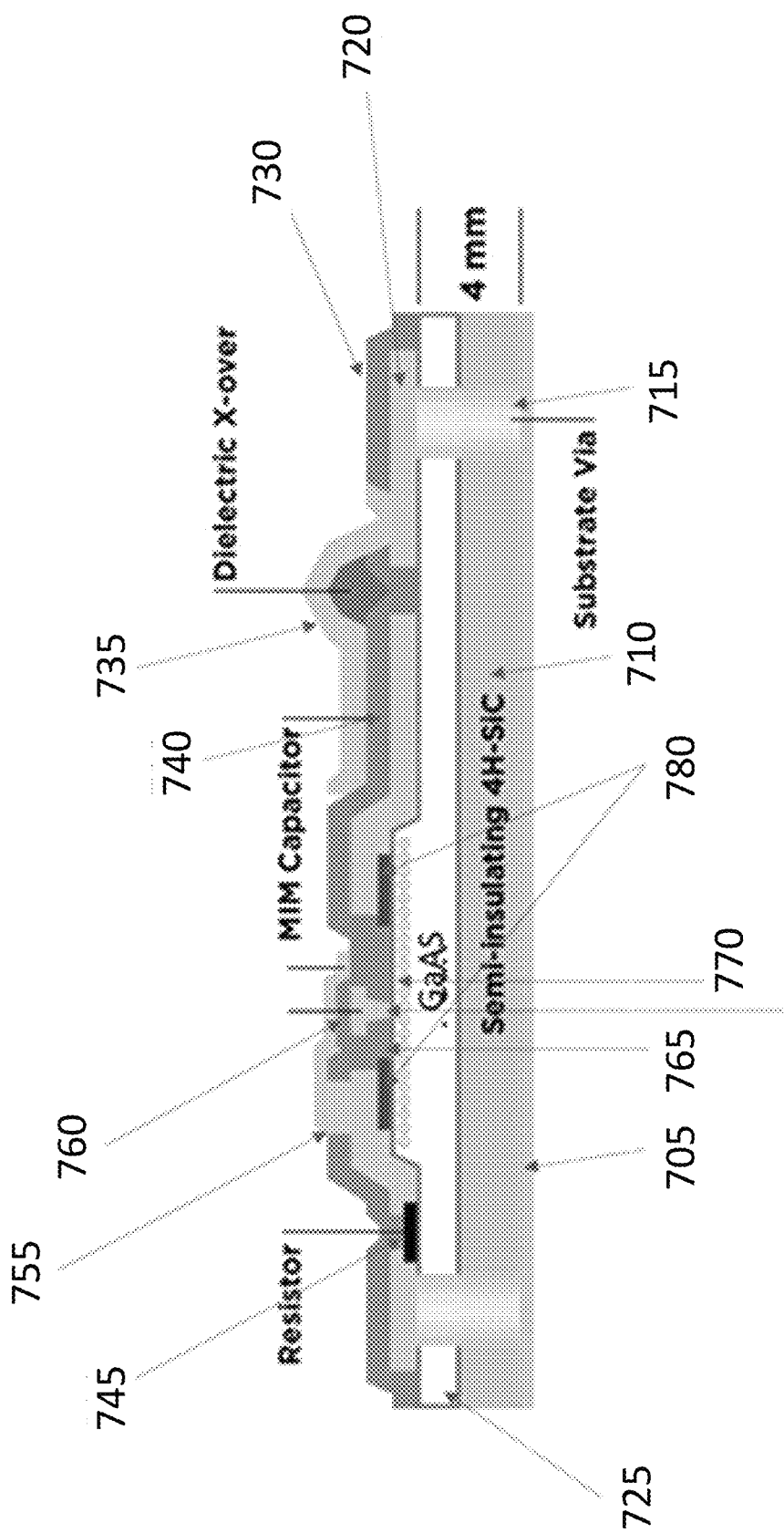
FIG. 7 shows a cross section of a monolithic millimeter/microwave integrated circuit (MMIC) that uses gallium arsenide (GaAs) field effect transistors (FETS).

FIG. 7 shows a cross section of a monolithic millimeter/microwave integrated circuit (MMIC) that uses gallium arsenide (GaAs) field effect transistors (FET). Note that the various components illustrated in FIG. 7 may be connected using wires like those illustrated in FIG. 5. Here again each of the wires could have an inductance such that those wire act as inductors at frequencies of 2 GHz (or 2000 MHz) to about 10 GHz (10000 MHz), for example. The MMIC of FIG. 7 could, thus, include numerous inductors capacitors, resistors, and connectors built into or onto a substrate of an integrated circuit. Item 705 may be a layer that is used to start a substrate, item may be a gold layer, for example. Item 710 may be a semi insulating layer like (e.g. a layer of Silicon Carbon) that was grown by epitaxial growth process.

GaAs FETs may also be grown on the semi-insulating layer 701. While the growth of GaAs features may require a seed layer to start a deposition process, this seed layer is not shown in FIG. 7. The process of growing the GaAs features may include masking parts of the substrate or partially grown FET and then growing a doped region of the GaAs FET. The MMIC of FIG. 7 includes resistor material region 745, formed barrier metal (silicide's) regions 780 on the source 765 and drain 770. The gate oxide regions may be 775 made, after which source 765 and drain 770 regions may be implanted with ions. Substrate metal via 715 may then be made and gold (AU) metallization layer 720 may be added.

Furthermore, metallization traces 735 & 755 may be deposited. Layers 720 and traces 735 & 755 may be used to interconnect 715 other features, such as gate 760, source 765 region, drain region 770, resistor contact 745 or a contact of a capacitor 740. The process of fabrication of an MMIC may include depositing portions of an insulator 730. The process of manufacturing the MMIC may also include depositing additional gold metallic features that electrically connect other components or features of the MMIC (e.g. other capacitors, resistors, or transistor contacts). Internal portions of the MMIC may also include ground contacts 725.

The materials in the transistor structure may be varied as the arrangement of the transistors in the parallel configuration are used to manufacture improved amplifiers. In certain instances, any type III-V semiconductor material may be used when an amplifier is manufactured.

Figure 8:
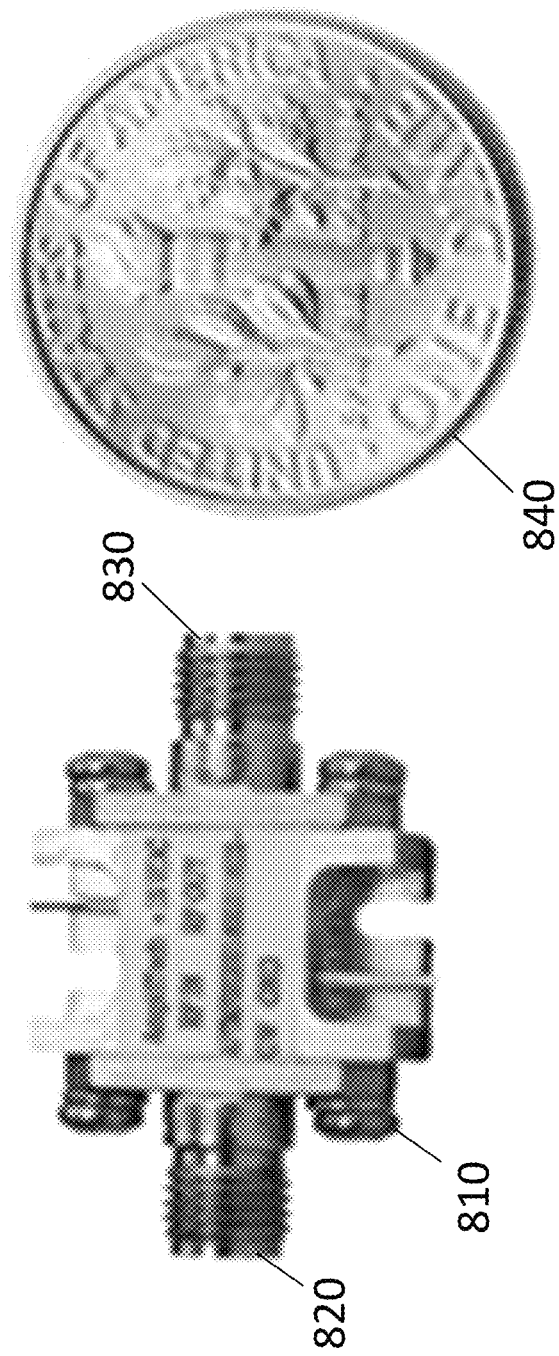
FIG. 8 illustrates a low noise amplifier built within a low noise box or shield.

FIG. 8 illustrates a low noise amplifier built within a low noise box or shield. Amplifier assembly 810 of FIG. 8 includes an input 820, an output 830, and an MMIC that is contained within the aforementioned box or shield. The MMIC contained within assembly 810 may be the three stage amplifier of FIG. 1 or FIG. 2. The boxes or shields that contain the MMIC amplifier may have specially designed transitions to provide an optimum broadband match and lowest insertion loss to yield a low noise factor. FIG. 8 also shows that the length or width of amplifier 810 may be close to the diameter of a United States (U.S.) dime 840 (i.e. a U.S. 10 cent or $0.10 piece).

The foregoing detailed description of the technology herein has been presented for purposes of illustration and description. It is not intended to be exhaustive or to limit the technology to the precise form disclosed. Many modifications and variations are possible in light of the above teaching. The described embodiments were chosen in order to best explain the principles of the technology and its practical application to thereby enable others skilled in the art to best utilize the technology in various embodiments and with various modifications as are suited to the particular use contemplated. It is intended that the scope of the technology be defined by the claim.

What is claimed is:

1. An amplifier comprising:
   an input of a first amplification stage that receives a signal;
   a first field effect transistor (FET) of a plurality of FETS of the first amplification stage disposed on a substrate, wherein the input is coupled to the first FET through a first inductor, wherein the first FET amplifies the signal to output a first amplified signal through a second inductor and a capacitor to an output of the first amplification stage;
   a second FET of the plurality of FETS of the first amplification stage disposed on the substrate, wherein the input is coupled to the second FET through a third inductor, wherein the second FET amplifies the signal to output a second amplified signal through a fourth inductor and the capacitor to the output;
   a third FET of the plurality of FETS of the first amplification stage disposed on the substrate, wherein the input is coupled to the third FET through a fifth inductor, wherein the third FET amplifies the signal to output a third amplified signal through a sixth inductor and the capacitor to the output; and
   the output of the first amplification stage that receives the first amplified signal and the second amplified signal and the third amplified signal through the capacitor, wherein the plurality of FETs are arranged in a parallel arrangement within the first amplification stage, wherein the plurality of FETs are each respectively tuned to different corner frequencies, wherein an effective gate width of the first amplification stage is greater than respective gate widths of respective gates of the plurality of FETs based on the parallel arrangement, wherein a noise figure of the first amplification stage is lower than respective noise figures of the plurality of FETs based on the parallel arrangement and the different corner frequencies, and wherein a return loss of the first amplification stage is lower than respective return losses of the plurality of FETs based on the parallel arrangement and the different corner frequencies.

2. The amplifier of claim 1, wherein the capacitor helps match an impedance associated with the first amplification stage with an impedance associated with a second amplification stage.

3. The amplifier of claim 1, wherein a frequency response of the first amplification stage is based on an inductance of the first inductor and an inductance of the second inductor.

4. The amplifier of claim 1, wherein a frequency response of the first amplification stage is based on an inductance of the first inductor, an inductance of the second inductor, an inductance of the third inductor, an inductance of the fourth inductor, an inductance of the fifth inductor, and an inductance of the sixth inductor.

5. The amplifier of claim 1, wherein the capacitor helps match an impedance associated with the first amplification stage with an impedance associated with a second amplification stage.

6. The amplifier of claim 1, wherein the plurality of FETs are each respectively tuned to have different frequency response characteristics.

7. The amplifier of claim 1, wherein the first FET is coupled to ground through a seventh inductor, wherein the second FET is coupled to ground through an eighth inductor, and wherein the third FET is coupled to ground through a ninth inductor.

8. The amplifier of claim 7, wherein a frequency response the first amplifier stage is based on respective inductances of the seventh inductor, the eighth inductor, and the ninth inductor.

9. The amplifier of claim 1, further comprising a second amplification stage that includes a fourth FET, wherein the second amplification stage is electrically coupled to the output of the first amplification stage and receives an amplified signal from the output of the first amplification stage.

10. The amplifier of claim 1, wherein an output impedance of the first amplification stage matches an input impedance of a second amplification stage, wherein the second amplification stage is coupled to the output of the first amplification stage.

11. An amplifier comprising:
    a substrate;
    an input that receives a signal;
    a first amplification stage that is located at the substrate and that includes a plurality of field effect transistor (FETs) arranged in a parallel arrangement, wherein the plurality of FETs includes a first FET and a second FET and a third FET, wherein the first FET receives the signal through a first inductor and amplifies the signal to output a first amplified signal through a second inductor and a capacitor to an output of the first amplification stage, wherein the second FET receives the signal through a third inductor and amplifies the signal to output a second amplified signal through a fourth inductor and the capacitor to the output of the first amplification stage, and wherein the third FET receives the signal through a fifth inductor and amplifies the signal to output a third amplified signal through a sixth inductor and the capacitor to the output; and
    the output of the first amplification stage that receives the first amplified signal and the second amplified signal and the third amplified signal through the capacitor, wherein the plurality of FETs are each respectively tuned to different corner frequencies, wherein an effective gate width of the first amplification stage is greater than respective gate widths of respective gates of the plurality of FETs based on the parallel arrangement, wherein a noise figure of the first amplification stage is lower than respective noise figures of the plurality of FETs based on the parallel arrangement and the different corner frequencies, and wherein a return loss of the first amplification stage is lower than respective return losses of the plurality of FETs based on the parallel arrangement and the different corner frequencies.

12. The amplifier of claim 11, further comprising a second amplification stage that includes a fourth FET, wherein the second amplification stage is electrically coupled to the output of the first amplification stage and receives an output signal from the output of the first amplification stage.

13. The amplifier of claim 12, wherein the second amplification stage includes the fourth FET and a fifth FET arranged in parallel.

14. The amplifier of claim 12, further comprising a third amplification stage that is electrically coupled to an output of the second amplification stage and receives a second output signal from the second amplification stage.

15. The amplifier of claim 11, wherein a frequency response of the first amplification stage is based on at least one impedance of at least one of the first inductor, the second inductor, the third inductor, the fourth inductor, the fifth inductor, or the sixth inductor.

16. A method for signal amplification, the method comprising:
receiving a signal at an input of a first amplification stage along a substrate;
amplifying the signal using a first field effect transistor (FET) along the substrate to output a first amplified signal through a first inductor and a capacitor to an output of the first amplification stage;
amplifying the signal using a second FET along the substrate to output a second amplified signal through a second inductor and the capacitor to the output of the first amplification stage;
amplifying the signal using a third FET along the substrate to output a third amplified signal through a third inductor and the capacitor to the output of the first amplification stage, wherein a plurality of FETs includes the first FET and the second FET and the third FET; and
receiving the first amplified signal and the second amplified signal and the third amplified signal at the output of the first amplification stage, wherein the plurality of FETs are arranged in a parallel arrangement within the first amplification stage, wherein the plurality of FETs are each respectively tuned to different corner frequencies, wherein an effective gate width of the first amplification stage is greater than respective gate widths of respective gates of the plurality of FETs based on the parallel arrangement, wherein a noise figure of the first amplification stage is lower than respective noise figures of the plurality of FETs based on the parallel arrangement and the different corner frequencies, and wherein a return loss of the first amplification stage is lower than respective return losses of the plurality of FETs based on the parallel arrangement and the different corner frequencies.

17. The method of claim 16, further comprising:
outputting an output signal from the output of the first amplification stage to a second amplification stage that includes a fourth FET.

18. The method of claim 17, wherein the second amplification stage includes a fifth FET.

19. The method of claim 18, wherein the second amplification stage includes a first leg that is parallel to a second leg, wherein the first leg includes the fourth FET, wherein the second leg includes fifth FET.

20. The method of claim 17, further comprising:
outputting a second output signal from an output of the second amplification stage to a third amplification stage that includes a fifth FET.

21. The amplifier of claim 1, wherein an output gain curve of output signal at the output of the first amplification stage exceeds a minimum gain threshold across an output frequency range, and wherein a first gain curve of the first amplified signal exceeds the minimum gain threshold across a first frequency range that is smaller than the output frequency range.

22. The amplifier of claim 1, wherein the first FET is tuned to a first corner frequency, wherein the second FET is tuned to a second corner frequency, and wherein the third FET is tuned to a third corner frequency.

23. The amplifier of claim 1, wherein respective parameters of the first FET and the second FET and the third FET include at least one metric based on at least one of transistor current or transistor voltage.

24. The amplifier of claim 1, wherein the parallel arrangement helps to minimize a degradation of a signal-to-noise ratio signal-to noise ratio of the first amplification stage.

* * * * *